United States Patent
Gardner et al.

(12)
(10) Patent No.: US 6,210,999 B1
(45) Date of Patent: Apr. 3, 2001

(54) METHOD AND TEST STRUCTURE FOR LOW-TEMPERATURE INTEGRATION OF HIGH DIELECTRIC CONSTANT GATE DIELECTRICS INTO SELF-ALIGNED SEMICONDUCTOR DEVICES

(75) Inventors: Mark I. Gardner, Cedar Creek; John L. Nistler, Martindale, both of TX (US); Charles E. May, Gresham, OR (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/205,047

(22) Filed: Dec. 4, 1998

(51) Int. Cl.$^7$ ............................................... H01L 21/338
(52) U.S. Cl. ........................ 438/183; 438/257; 257/332
(58) Field of Search ................................. 438/183, 305, 438/308, 435, 589, 257, 299, 301; 257/310, 329, 332, 389, 409

(56) References Cited

U.S. PATENT DOCUMENTS

| | | | |
|---|---|---|---|
| 3,528,168 | 9/1970 | Adamic, Jr. | 438/289 |
| 5,285,093 * | 2/1994 | Lage et al. | 257/332 |
| 5,391,510 | 2/1995 | Hsu et al. | 438/301 |
| 5,576,227 | 11/1996 | Hsu | 438/291 |
| 5,744,845 | 4/1998 | Sayama et al. | 257/371 |
| 5,811,347 * | 9/1998 | Gardner et al. | 438/435 |
| 5,937,303 * | 8/1999 | Gardner et al. | 438/305 |
| 5,940,698 | 8/1999 | Gardner et al. | 438/197 |
| 5,998,288 * | 12/1999 | Gardner et al. | 438/589 |
| 6,043,157 | 3/2000 | Gardner et al. | 438/692 |
| 6,051,487 | 4/2000 | Gardner et al. | 438/585 |

* cited by examiner

*Primary Examiner*—David Nelms
*Assistant Examiner*—Phuc T. Dang
(74) *Attorney, Agent, or Firm*—Kevin L. Daffer; Conley, Rose & Tayon

(57) ABSTRACT

A self-aligned semiconductor device including a high-K dielectric which is not exposed to elevated processing temperatures and a method for producing this device are provided. The method may also be used to fabricate a test structure, with which multiple combinations of gate dielectric/conductor configurations may be tested quickly and inexpensively. A self-aligned transistor is fabricated on a semiconductor substrate. Protective dielectrics are subsequently formed over the substrate and surrounding the transistor gate conductor such that upper surfaces of the dielectrics are even with the upper surface of the gate conductor. This dielectric-protected transistor forms a test structure which may be used to evaluate various gate dielectric/conductor configurations. The test structure is formed relatively simply using only two masking steps, and is believed to be particularly suited for evaluation of high-K gate dielectric configurations. The transistor gate conductor may be subsequently removed without disturbing the rest of the transistor. The removed gate conductor may be replaced with materials including high-K dielectrics, metals, and polysilicon. Because source and drain regions are formed before formation of the protective dielectrics, the gate dielectric/conductor materials used to replace the original gate conductor are not exposed to the elevated temperatures which may be used for impurity introduction.

28 Claims, 6 Drawing Sheets

METHOD AND TEST STRUCTURE FOR LOW-TEMPERATURE INTEGRATION OF HIGH DIELECTRIC CONSTANT GATE DIELECTRICS INTO SELF-ALIGNED SEMICONDUCTOR DEVICES

BACKGROUND OF THE INVENTION

1. Field of the Invention

This invention relates to integrated circuit fabrication and, more particularly, to a semiconductor device employing a high dielectric constant ("high-K") gate dielectric and a method for forming this device which avoids exposing the high-K dielectric to high processing temperatures. The invention further relates to a test structure for rapid and inexpensive evaluation of gate dielectric/conductor configurations, and a method for forming such a test structure.

2. Description of the Relevant Art

Fabrication of a metal-oxide-semiconductor (MOS) integrated circuit involves numerous processing steps. A gate dielectric, typically formed from silicon dioxide ("oxide"), is formed on a semiconductor substrate which is doped with either n-type or p-type impurities. For each MOS field effect transistor (MOSFET) being formed, a gate conductor is formed over the gate dielectric, and dopant impurities are introduced into the substrate to form a source and drain. A pervasive trend in modern integrated circuit manufacture is to produce transistors having feature sizes as small as possible. Many modern day processes employ features, such as gate conductors and interconnects, which have less than 1.0 μm critical dimension. As feature size decreases, the size of the resulting transistor as well as the interconnect between transistors also decreases. Fabrication of smaller transistors allows more transistors to be placed on a single monolithic substrate, thereby allowing relatively large circuit systems to be incorporated on a single, relatively small die area.

As MOSFET feature sizes decrease, gate oxide thickness decreases as well. This decrease in gate oxide thickness is driven in part by the demands of overall device scaling. As gate conductor widths decrease, for example, other device dimensions must also decrease in order to maintain proper device operation. Early MOSFET scaling techniques involved decreasing all dimensions and voltages by a constant scaling factor, to maintain constant electric fields in the device as the feature size decreased. This approach has given way to more flexible scaling guidelines which account for operating characteristics of short-channel devices. For example, a maximum value of MOSFET subthreshold current can be maintained while feature sizes shrink, by decreasing any or all of several quantities, including gate oxide thickness, operating voltage, depletion width, and junction depth, by appropriate amounts.

Another factor driving reduction of gate oxide thickness is the increased transistor drain current realized for a reduced gate dielectric thickness. Higher transistor drain currents are desirable because they allow each transistor to drive a greater number of other transistors, and can result in increased switching speeds. The transistor drain current is proportional to the amount of charge induced in the transistor channel region by the voltage applied to the gate conductor. The amount of charge induced by a given voltage drop across the gate oxide is the voltage drop multiplied by the capacitance of the oxide. Increasing the capacitance of the oxide therefore increases the transistor drain current. The capacitance C of the oxide can be written as for a parallel plate capacitor:

$$C = \epsilon A / t_{ox},$$

where $\epsilon$ is the permittivity of the oxide, A is its area, and $t_{ox}$ is the oxide thickness. The value of the capacitance is therefore dependent upon both the thickness and the permittivity of the gate oxide.

In order to achieve increased capacitance, gate oxide thickness has been reduced so much that current oxides are on the order of ten angstroms thick. Unfortunately, thin oxide films may break down when subjected to an electric field, particularly for gate oxides less than 50 Å thick. It is probable that even for a relatively low gate voltage of 3V, electrons can pass through a thin gate oxide by what is known as the quantum mechanical tunneling effect. In this manner, a tunneling current may undesirably form between the semiconductor substrate and the gate conductor, adversely affecting the operability of the device. It is postulated that some of these electrons may become entrapped within the gate oxide by e.g., dangling bonds. As a result, a net negative charge density may form in the gate oxide. As the trapped charge accumulates with time, the threshold voltage $V_T$ may shift from its design specification. Breakdown of the gate oxide may also occur at even lower values of gate voltage, as a result of defects in the gate oxide. Such defects are unfortunately prevalent in relatively thin gate oxides. For example, a thin gate oxide often contains pinholes and/or localized voids due to unevenness at which the oxide grows on a less than perfect silicon lattice.

A more promising approach to further increasing gate dielectric capacitance may be to increase the permittivity of the gate dielectric. Permittivity, $\epsilon$, of a material reflects the ability of the material to be polarized by an electric field. The permittivity of a material is typically described as its permittivity normalized to the permittivity of a vacuum, $\epsilon_0$. Hence, the relative permittivity or dielectric constant of a material is defined as:

$$K = \epsilon / \epsilon_0$$

While oxide has a dielectric constant of approximately 4, other materials have higher K values. Silicon nitride ("nitride"), for example, has a K of about 6 to 9 (depending on formation conditions). Much higher K values of, for example, 20 or more can be obtained with various transition metal oxides including tantalum oxide ($Ta_2O_5$), barium strontium titanate ("BST"), and lead zirconate titanate ("PZT"). Using a high-K material for a gate dielectric would allow a high capacitance to be achieved even with a relatively thick dielectric. For example, a nitride gate dielectric having a thickness of 100 angstroms is substantially electrically equivalent to an oxide gate dielectric having a thickness of about 50 angstroms. For even higher-K dielectrics, even thicker gate dielectrics could be formed while maintaining capacitance values higher than are possible with even very thin oxide layers. In this way, the reliability problems associated with very thin dielectric layers may be avoided while transistor performance is increased.

Although the high K values of the metal oxide dielectrics noted above make them attractive gate dielectric candidates, integration of these materials into a MOSFET does present problems. In particular, metal and oxygen atoms from these metal oxides may diffuse into and react with an underlying silicon channel region or an overlying polysilicon gate conductor. Many metal atoms are associated with carrier trap states in silicon, so that carrier lifetime in a device may be reduced by diffusion of metal atoms into an active region of the device. Maintaining low processing temperatures may help to prevent interdiffusion of high-K materials and silicon during MOSFET fabrication. Unfortunately, typical MOSFET fabrication processes expose gate conductors and gate dielectrics to elevated temperatures in order to produce self-aligned source and drain regions. These source and drain regions exhibit minimal overlap with the transistor gate, minimizing the parasitic capacitances that limit high-frequency transistor performance. In general, the self-alignment is achieved by fabricating a gate conductor over a gate dielectric, and then using the gate conductor as a mask for introduction of dopant impurities to form the source and drain. The source and drain impurities are typically introduced using ion implantation. Because they are formed before the implantation and subsequent annealing of the source and drain impurities, the gate conductor and gate dielectric must be made from materials which can withstand high-temperature processing.

In addition to the interdiffusion problem discussed above, integration of high-K dielectrics into MOS integrated circuit production flows may present other challenges. Because movement toward high-K dielectrics in MOS processing is currently in its early stages, much experimentation will be needed to establish myriad aspects of production, such as material selection, deposition parameters, and etch techniques. Performing a complete transistor fabrication process for testing of each combination of the many variables involved is extremely expensive and time-consuming.

It would therefore be desirable to develop a technique for fabricating a transistor having a gate dielectric formed from a high-K material. The desired process should not expose the high-K material to elevated temperatures, such as those required for annealing the source and drain implants. However, the gate conductor of the transistor should be self-aligned to the transistor source and drain regions. It would further be desirable to develop a simplified method for fabrication of devices for testing of high-K dielectric materials.

SUMMARY OF THE INVENTION

The problems outlined above are in large part addressed by a method in which a self-aligned gate structure containing a high-K dielectric is formed after high-temperature processes involving, e.g., the source and drain anneal cycles. A transistor which may include dielectric sidewall spacers is fabricated on a semiconductor substrate. Self-aligned source and drain impurity introduction may be included in this fabrication, and a salicide process may be performed. Protective dielectrics are subsequently formed over the substrate and surrounding the transistor gate conductor such that upper surfaces of the dielectrics are even with the upper surface of the gate conductor. In this way, all upper surfaces of the transistor except the upper surface of the gate conductor may be protected by dielectric.

At least a portion of the gate conductor is subsequently removed by a self-aligned, selective etch process to produce a trench within the previously formed polysilicon gate. A base of the trench may comprise an upper surface of the remaining gate conductor or an upper surface of the previously formed gate dielectric. Depending on the desired operating characteristics of the finalized device, this trench may subsequently be refilled with materials including high-K dielectrics, metals, and/or polysilicon. Any material deposited external to the trench is subsequently removed, preferably using chemical-mechanical polishing (CMP), as in a damascene process. Openings may be formed in the protective dielectrics to allow contact to the source and drain regions, and further dielectric and conductor depositions may be used for interconnect formation by methods well-known in the art.

The protective dielectrics or sidewall spacers formed adjacent to the original gate conductor may serve to define the dimensions of the new gate structure formed after a portion of the gate conductor is removed. In this manner, although the new gate structure is formed after the source and drain regions of the transistor, it may be self-aligned to them nonetheless. Because the new gate structure is formed after the high-temperature source and drain formation as well as after all high-temperature growth and/or anneal cycles, it may be formed from a material which should not be exposed to high-temperature processing. In particular, high-K dielectrics such as transition metal oxides may be used with decreased concern as to whether a high-K dielectric will diffuse into and/or react with neighboring silicon regions. In a preferred embodiment, a nitrogen-containing oxide layer is formed upon an underlying silicon region before deposition of a high-K dielectric into the trench formed by removal of a portion of the polysilicon gate conductor. This oxide layer may serve as an interfacial layer between the high-K dielectric and the silicon, so that defects and dangling bonds are minimized. Additional interfacial layers such as nitride may also be formed below the high-K dielectric.

If part of a polysilicon gate conductor is removed as described above, a dual-gate memory cell having a high-K dielectric between a polysilicon lower gate and a conductive upper gate may be fabricated by placing a high-K dielectric layer on the remaining polysilicon and forming a conductive layer over the high-K dielectric layer. Portions of the deposited layers which are external to the trench are subsequently removed. The increased capacitance provided by use of a high-K intergate dielectric may allow such a memory cell to have a reduced gate area and retain an optimal "program" charge, comparable to that of a larger memory cell using a conventional oxide dielectric.

In addition to the process described above, a semiconductor device having a self-aligned gate structure containing a high-K dielectric is contemplated herein. A gate structure, which includes a gate region and may include sidewall spacers, is arranged above an active region of a semiconductor substrate. A high-K gate dielectric may be interposed between the gate region and the active region, and protective dielectrics are arranged above the active region and adjacent to lateral surfaces of the gate structure. The gate region may include materials such as high-K dielectrics, polysilicon, and metals. Embodiments of this device include a transistor having a high-K gate dielectric, and a dual-gate memory cell having a high-K intergate dielectric.

A test structure and method for evaluation of alternative gate dielectric and gate conductor materials are also contemplated herein. The test structure, containing a transistor with protective dielectrics, may be formed with only two masking steps, one for isolation region definition, and one for patterning of the original gate conductor. A group of many test structure wafers may be formed in one processing run, and subsequently divided for formation of various gate dielectric/conductor configurations for evaluation. Replacement of the original gate conductor in the test structure with the new gate conductor and/or dielectric to be tested involves no masking steps; only etch, deposition, and CMP processes are needed. After formation of the gate dielectric/conductor configuration to be tested, the protective dielectrics are typically etched away so that the device may be rapidly tested using electrical probes. Such testing may include, for example, obtaining transistor current-voltage (I-V) characteristics using source, drain, and gate probes. Testing may also include capacitance-voltage (C-V) profiling of the gate-to-channel capacitor using, for example, gate and substrate probes.

BRIEF DESCRIPTION OF THE DRAWINGS

Other objects and advantages of the invention will become apparent upon reading the following detailed description and upon reference to the accompanying drawings in which.

Figure 1:
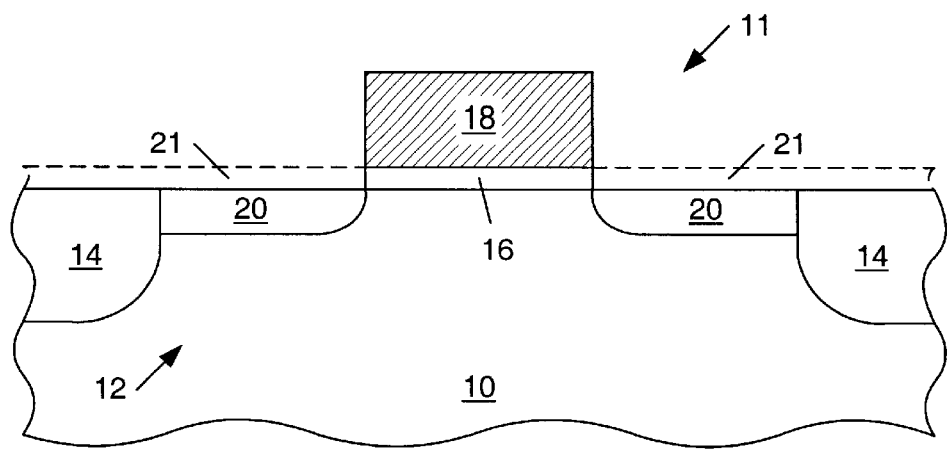
FIG. 1 is a partial cross-sectional view of a semiconductor topography including an active region within a semiconductor substrate upon which a transistor is formed, wherein the transistor includes a gate dielectric, a gate conductor, and source and drain impurity distributions.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed. On the contrary, the intention is to cover all modifications, equivalents, and alternatives falling within the spirit and scope of the present invention.

DETAILED DESCRIPTION OF THE PREFERRED EMBODIMENTS

Turning to the drawings, FIG. 1 illustrates a partial cross-section of a transistor 11 formed in an active region 12 of a semiconductor substrate 10, according to an embodiment of the process recited herein. Active region 12 is separated from adjacent active regions by isolation regions 14. A gate dielectric 16 and a gate conductor 18 are formed above the active region, and source and drain impurity distributions 20 may be introduced and electrically activated (annealed) within substrate 10, self-aligned to gate conductor 18. In this case, gate dielectric portions 21 (shown by dashed lines) not covered by gate conductor 18 have been removed. Alternatively, portions 21 may be left in place for subsequent processing steps, as long as they are removed before making contact to the source and drain regions.

Semiconductor substrate 10 is preferably monocrystalline silicon, and is doped either n-type or p-type. Substrate 10 may be an epitaxial silicon layer grown on a monocrystalline silicon substrate, or an n-type or p-type well region formed in a monocrystalline silicon substrate. Isolation regions 14 may be formed by methods well known in the art. One such method is the formation of trenches which are subsequently filled with a deposited dielectric, while another method which may be used is local oxidation of the substrate, using silicon nitride to mask the active regions. Gate dielectric 16 is preferably grown by heating substrate 10 to a temperature of greater than about 700° C. in an oxidizing ambient to grow oxide, a nitrogen-bearing ambient to grow nitride, or an ambient containing both oxygen and nitrogen to form an oxynitride or nitrided oxide. Nitrogen-containing dielectrics may be preferred for applications in which a diffusion barrier may be needed, such as the high-K dielectric formation described below. Other gate dielectrics may also be used, including deposited oxide, nitride or oxynitride layers. Gate dielectric 16 preferably has a thickness of about 10 angstroms or less. Gate conductor 18 is preferably a polysilicon gate conductor or any conductive (or to be rendered conductive) material capable of withstanding high temperature cycles. A polysilicon gate is patterned from a polysilicon layer which is deposited using chemical vapor deposition (CVD) of silicon from, for example, a silane source. Such a CVD process may alternatively result in an amorphous silicon layer, particularly if low substrate temperatures are used. An amorphous silicon layer may be patterned to form gate conductor 18, and other materials which can withstand subsequent processing (such as that needed to form source and drain regions) may also be used. Impurity distributions 20 are preferably introduced using ion implantation, and are of opposite type to that of substrate 10. For an n-channel transistor, for example, substrate 10 is p-type and distributions 20 are n-type. Typical n-type dopants include arsenic, antimony and phosphorus, while boron is a typical p-type dopant. If source and drain impurity distributions 20 are introduced by ion implantation, a subsequent anneal is performed in order to activate the impurities and repair damage to substrate 10.

Figure 2:
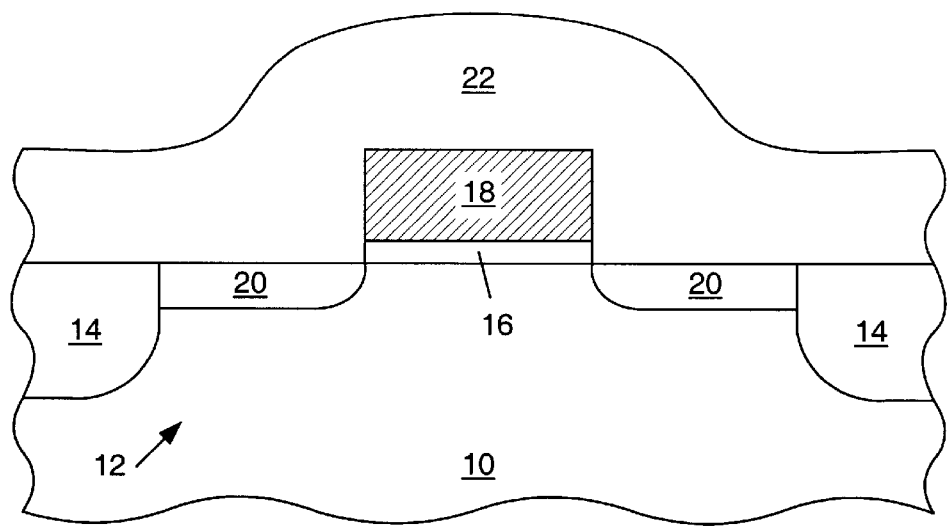
FIG. 2 is a partial cross-sectional view of the semiconductor topography wherein a dielectric layer is deposited over the transistor, subsequent to the transistor formation of FIG. 1.

Conformal dielectric layer 22 is subsequently deposited over transistor 11, as shown in FIG. 2. Dielectric layer 22 is typically silicon dioxide deposited by CVD. In particular, decomposition of tetraethyl orthosilicate (TEOS) may be performed in a plasma-enhanced chemical vapor deposition (PECVD) reactor at a substrate temperature in the range from about 200° C. to about 500° C. to produce a very conformal film. Other techniques which may be used to deposit silicon dioxide for dielectric layer 22 include atmospheric-pressure CVD (APCVD) and low-pressure CVD (LPCVD) using TEOS or silane sources. Dielectric layer 22 may also be formed from a different dielectric, such as silicon nitride or silicon oxynitride.

Figure 3:
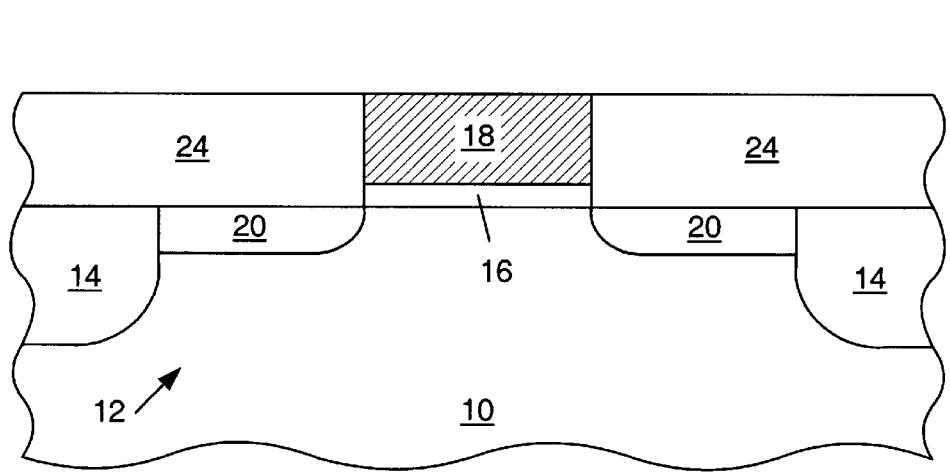
FIG. 3 is a partial cross-sectional view of the semiconductor topography wherein portions of the dielectric layer are removed such that protective dielectrics having upper surfaces at the same level as the upper surface of the gate conductor are formed, subsequent to the deposition of FIG. 2.

Portions of dielectric layer 22 which extend above the upper surface of gate conductor 18 are subsequently removed, as shown in FIG. 3. The removal process is preferably performed using chemical-mechanical polishing (CMP), or a combination of CMP and etchback. The remaining portions of dielectric layer 22 form protective dielectrics 24, which have upper surfaces at the same level as the upper surface of gate conductor 18. In this manner, all upper surfaces of transistor 11, except for the upper surface of gate conductor 18, are protected by dielectrics 24. The combination of transistor 11 and dielectrics 24 forms test structure 25, shown in FIG. 3, which may be used for rapid and inexpensive evaluation of various gate dielectric/conductor materials and configurations. Only two masking steps are used to produce test structure 25: one to pattern isolation regions 14, and one to pattern gate conductor 18. Multiple wafers containing test structure 25 may therefore be fabricated relatively quickly and inexpensively. Gate conductors 18 of test structures on individual wafers (or small groups of wafers, as desired) may subsequently be removed and replaced with a particular gate dielectric/conductor configuration, as described further below. Test structure 25 may be particularly useful for evaluating various high-K dielectrics for use in MOS devices. Gate conductor materials to be combined with particular high-K dielectrics may also be evaluated using test structure 25. Transistor 11 of test structure 25 is a very simple transistor, formed without dielectric spacers or lightly-doped drain (LDD) regions. Alternatively, more elaborate transistor structures may be formed before formation of protective dielectrics 24, as is illustrated by the embodiment of FIGS. 10–17 described below.

Figure 4:
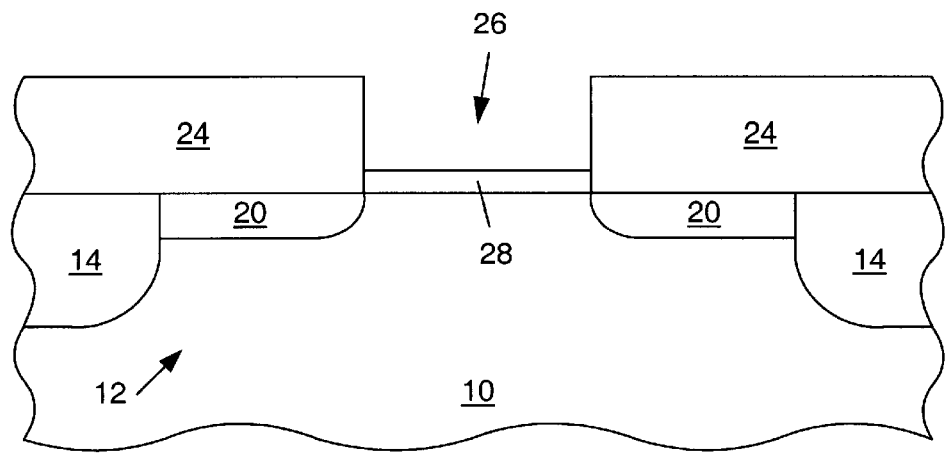
FIG. 4 is a partial cross-sectional view of the semiconductor topography wherein the gate conductor is removed such that a trench is formed, subsequent to the dielectric region formation of FIG. 3.

To form a self-aligned device containing a high-K dielectric from test structure 25, gate conductor 18 may subsequently be removed, as shown in FIG. 4. This removal is preferably done using an etching process. In a preferred embodiment for which gate conductor 18 is polysilicon, gate conductor 18 is removed using an etch having a high selectivity for polysilicon over dielectrics, so that gate dielectric 16 and protective dielectrics 24 are not removed. A suitable etch may be a chlorine-containing plasma etch process. Removal of gate conductor 18 forms trench 26 which is bounded by gate dielectric 16 and sidewalls of dielectric regions 24.

Figure 5:
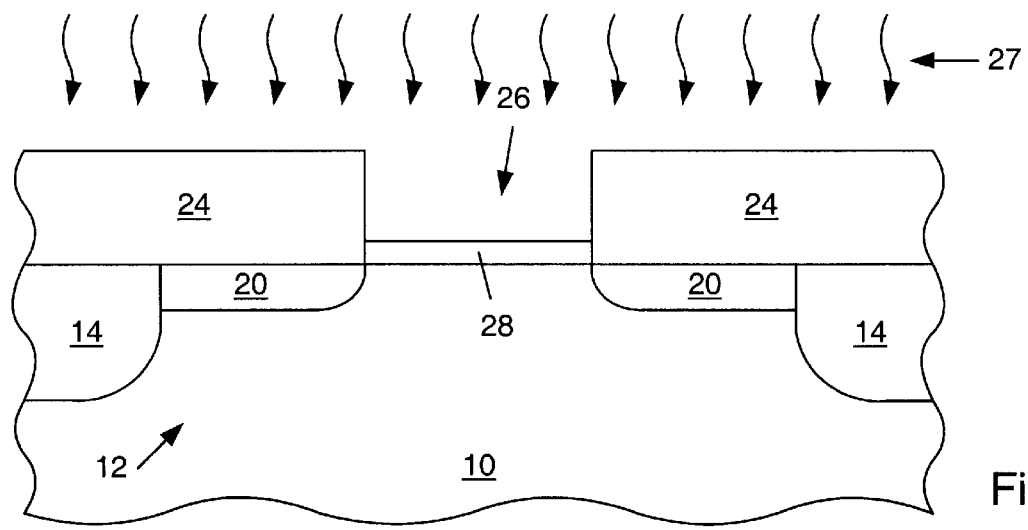
FIG. 5 is a partial cross-sectional view of the semiconductor topography wherein the gate dielectric is heated in a nitrogen-bearing ambient, subsequent to the gate conductor removal of FIG. 4.

In an embodiment for which gate dielectric 16 is formed from oxide, thermal process 27 may be used to convert dielectric 16 to nitrogen-containing dielectric 28, as shown in FIG. 5. Thermal process 27 includes heating dielectric 16 to a temperature between about 300° C. and about 1000° C. in a nitrogen-bearing ambient. For use of the lower end of this temperature range, the nitrogen-bearing ambient is preferably a plasma. Suitable ambients may include, for example, ammonia, an ammonia plasma, nitrogen, or a nitrogen plasma. In embodiments for which gate dielectric 16 is originally formed as a nitrogen-containing dielectric, thermal process 27 may be unnecessary.

Figure 6:
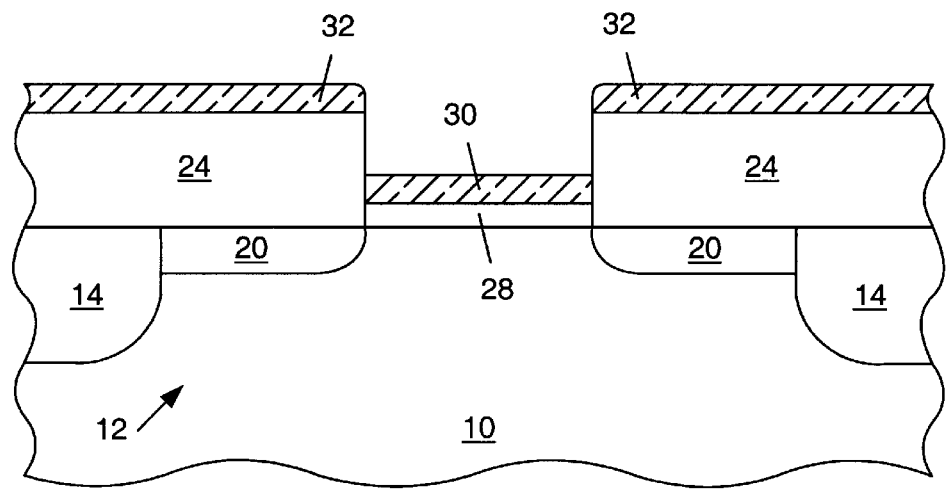
FIG. 6 is a partial cross-sectional view of the semiconductor topography wherein a layer of high-K dielectric material is deposited within the trench, subsequent to the heating of FIG. 5.

High-K dielectric portion 30 may subsequently be deposited into trench 26, as shown in FIG. 6, while portions 32 are deposited over dielectrics 24. High-K dielectrics 30 and 32 are preferably formed from a high-K metal oxide, such as $Ta_2O_5$, BST, or PZT. Other suitable metal oxides may include chromium oxide ($CrO_2$), zirconium oxide ($ZrO_2$), titanium dioxide ($TiO_2$), or other transition metal oxides. Other types of high-K material, such as nitride, may also be used. In the embodiment of FIG. 6, a non-conformal deposition technique, such as sputtering, is used to deposit high-K dielectric portions 30 and 32. In this way, portion 30 has a uniform thickness across trench 26 because no high-K material is deposited on sidewalls of the trench. The desired thickness of high-K dielectric portion 30 may range from about 10 angstroms to more than 100 angstroms, depending on the K value of the particular dielectric used.

Figure 7:
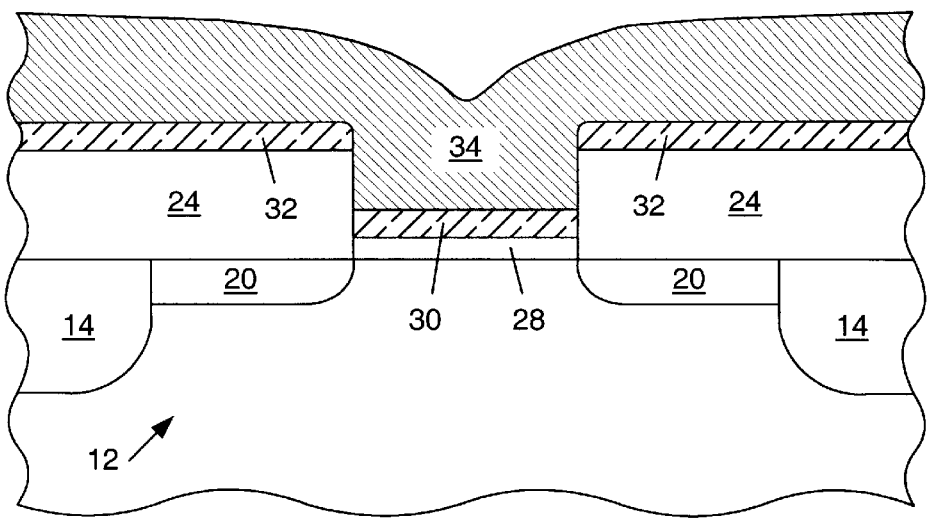
FIG. 7 is a partial cross-sectional view of the semiconductor topography wherein a conductive material is deposited to fill the trench, subsequent to the high-K dielectric deposition of FIG. 6.

Conductive layer 34 may then be deposited over high-K dielectric portion 30 and dielectrics 24 so that the remainder of trench 26 is filled, as shown in FIG. 7. Conductive layer 34 may be formed from conductive materials including doped polysilicon, metals, and/or conducting metal oxides. If polysilicon is used, a diffusion barrier layer formed from, for example, nitride or oxynitride may first be deposited over high-K portion 30. Because conductive layer 34 is not expected to undergo subsequent high-temperature processing, low-temperature metals such as aluminum or copper may be suitable for conductive layer 34. Other metals which may be suitable for use in combination with high-K dielectric portion 30 include ruthenium, platinum, iridium, and other metals resistant towards oxidation. Conductive metal oxides which may be suitable for use with high-K dielectrics include indium tin oxide.

Figure 8:
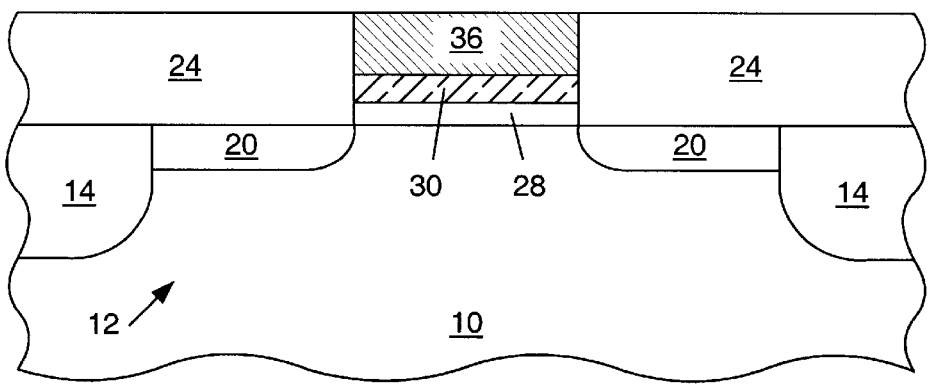
FIG. 8 is a partial cross-sectional view of the semiconductor topography wherein portions of the conductive material external to the trench are removed, subsequent to the deposition of FIG. 7.
Figure 9:
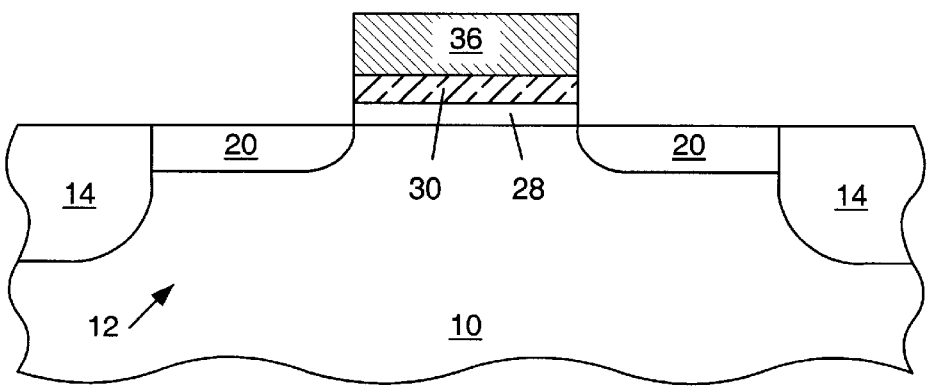
FIG. 9 is a partial cross-sectional view of the semiconductor topography wherein the protective dielectrics are removed, subsequent to the conductive material removal of FIG. 8.

Portions of conductive layer 34 external to the trench are subsequently removed, along with high-K dielectric portions 32, to form conductive gate 36 as shown in FIG. 8. This removal is preferably accomplished by CMP. Alternatively, portions 32 may be removed by CMP prior to deposition of conductive layer 34. Portions of layer 34 external to the trench would then be removed to achieve the structure shown in FIG. 8. This structure may be used either as a transistor in an MOS circuit, or as a test device to evaluate the combination of high-K dielectric 30 and gate conductor 36. If a transistor is to be formed, contact windows are subsequently opened in dielectrics 24 to allow connection to source and drain impurity distributions 20. Further deposition and patterning of conductors and dielectrics to form interconnects may then be performed in a manner known in the art. If a test device is to be formed, on the other hand, dielectrics 24 are typically etched away, as shown in FIG. 9, so that rapid electrical characterization may be performed using electrical probes. Probes may easily contact the source, drain, and/or gate of the device of FIG. 9. Electrical characterization may include plotting of I-V characteristics of the transistor of FIG. 9 using source, drain, and gate probes. C-V profiling of the gate-to-channel capacitor could also be performed using, for example, gate and substrate probes. Parameters which may be varied in producing a set of test devices include, for example, thickness of high-K dielectric 30, deposition conditions of high-K dielectric 30, and material composition of high-K dielectric 30. Similar parameters may also be varied for dielectric layer 28 and/or gate conductor 36 in other test devices.

Figure 10:
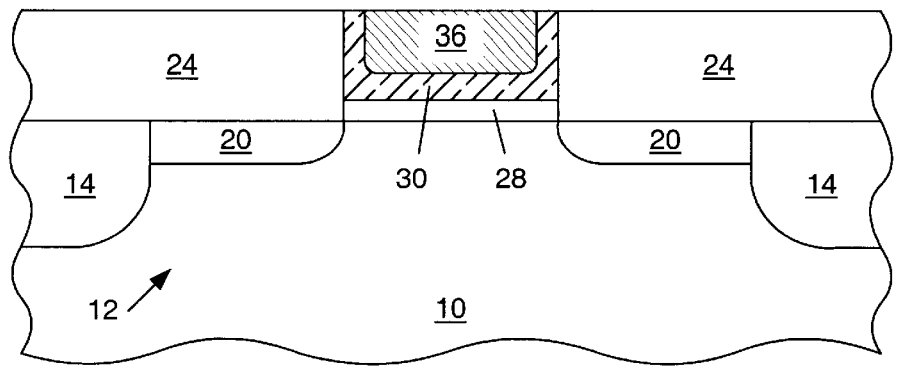
FIG. 10 is a partial cross-sectional view of the semiconductor topography in an alternative embodiment for which a conformal deposition technique is used for the high-K dielectric deposition of FIG. 6, followed by the gate conductor formation of FIGS. 7 and 8.

In an embodiment for which the high-K dielectric deposition of FIG. 6 is performed using a conformal deposition technique such as chemical vapor deposition (CVD), the structure of FIG. 10 results after formation of gate conductor 36 as shown in FIGS. 7 and 8. High-K dielectric 30 in FIG. 10 has a U-shaped profile resulting from deposition on sidewalls of trench 26. This causes a slight reduction in the widths of gate conductor 36 and the underlying transistor channel. Because the thickness of high-K dielectric 36 is typically on the order of 100 angstroms or less, this channel length reduction is believed to be quite small. In fact, diffusion of source and drain impurity distributions 20 during the normal course of the fabrication process is expected to prevent any "gap" from existing in the horizontal alignment between the edges of gate conductor 36 and the edges of source and drain distributions 20. The channel length reduction illustrated in FIG. 10 may be advantageous if a slightly shorter channel is desired than may be realized during lithographic definition of original gate conductor 18.

Figure 11:
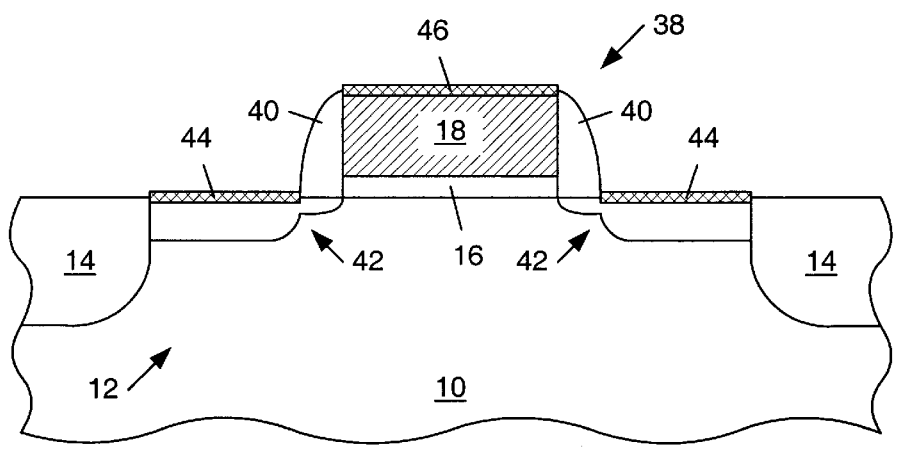
FIG. 11 is a partial cross-sectional view of a semiconductor topography according to an alternative embodiment, wherein a transistor is formed upon an active region of a semiconductor substrate, and wherein the transistor includes a polysilicon gate conductor, a pair of dielectric sidewall spacers, a gate dielectric, source and drain impurity distributions self-aligned both to the gate region and to the sidewall spacer, and silicide regions on upper surfaces of the source, drain and gate region.

Turning now to FIG. 11, a partial cross section of a transistor 38 formed in active region 12 according to an alternative embodiment is shown. Transistor 38 differs from transistor 11 shown in FIG. 1 in several respects. For example, dielectric spacers 40 are formed adjacent to polysilicon (in this embodiment) gate conductor 18, to form a gate structure including gate conductor 18 and spacers 40. Instead of a single impurity introduction to form source and drain regions, as for transistor 11, source and drain regions 42 of transistor 38 may be formed using a lightly-doped impurity distribution self-aligned to gate conductor 18 and a heavily-doped impurity distribution self-aligned to lateral surfaces of spacers 40, as is well-known in the art. Following the formation of source and drain regions 42, a salicide process may be performed in a manner well-known in the art to form silicide regions 44 on upper surfaces of source and drain regions 42, and silicide region 46 on the upper surface of polysilicon gate conductor 18. Formation of spacers 40 may be advantageous for reasons including the ability to form lightly-doped regions under the spacers which may lower the maximum electric field developed at the drain end of the channel. This lowered electric field may reduce the severity of hot-carrier effects such as avalanche breakdown at the drain/substrate junction and injection of carriers into the gate dielectric. Spacers 40 may also be advantageous by providing isolation between the source/drain and gate regions so that a salicide process may be performed. Spacers 40 are typically silicon dioxide, formed by CVD of a conformal silicon dioxide layer and anisotropic etching of the layer to form spacers. Spacers 40 may also be formed from other dielectrics such as silicon nitride or silicon oxynitride.

Figure 12:
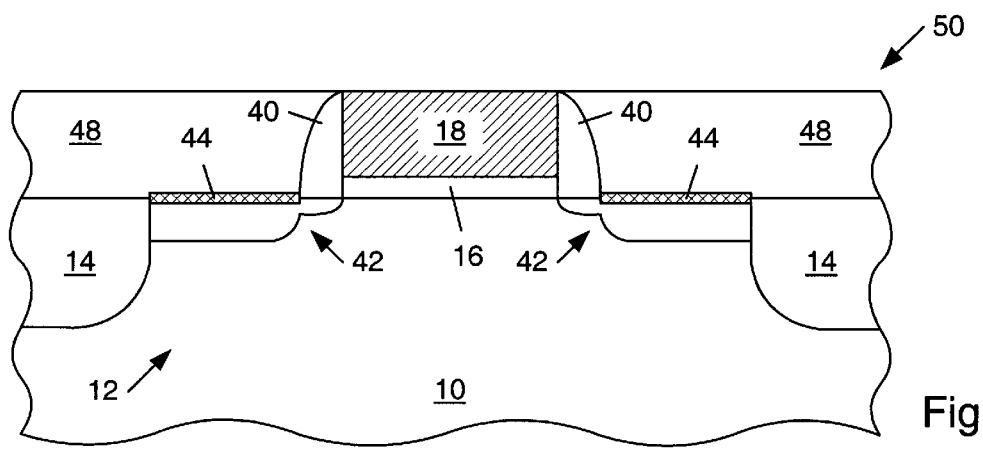
FIG. 12 is a partial cross-sectional view of the semiconductor topography wherein protective dielectrics are formed upon the semiconductor substrate adjacent to the dielectric spacers, subsequent to the transistor formation of FIG. 11.

Protective dielectrics 48 are subsequently formed upon substrate 10 adjacent to exposed lateral sidewalls of spacers 40, as shown in FIG. 12. Protective dielectrics 48 are formed in a manner similar to the formation of protective dielectrics 24 shown in FIGS. 2 and 3. In the case shown, gate region silicide 46 is removed during the CMP process. Alternatively, a portion of the gate silicide may remain after formation of dielectric regions 48. This silicide portion is removed when a portion of gate conductor 18 is subsequently removed. The combination of transistor 38 and dielectrics 48 forms test structure 50 which may be used for rapid and inexpensive evaluation of various gate dielectric/conductor materials and configurations. As for test structure 25 shown in FIG. 3, only two masking steps are used to produce test structure 50, so that multiple wafers containing test structure 50 may therefore be fabricated relatively quickly and inexpensively. Gate conductors 18 from structures on individual wafers (or small groups of wafers, as desired) may subsequently be removed and replaced with a particular gate dielectric/conductor configuration, as described further below. Test structure 50 may be used in the same manner as test structure 25 of FIG. 3 for evaluating various fabrication techniques and configurations for devices containing high-K gate dielectrics.

Figure 13:
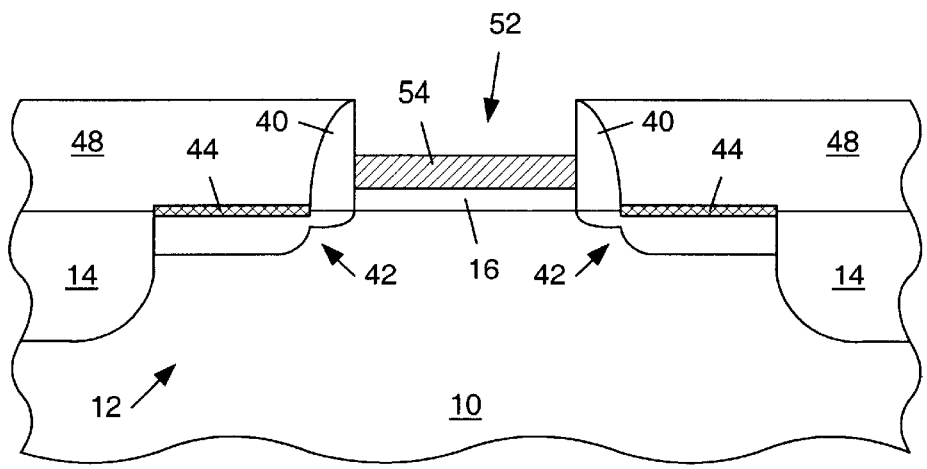
FIG. 13 is a partial cross-sectional view of the semiconductor topography wherein a portion of the polysilicon gate conductor is removed to form a trench, subsequent to the dielectric region formation of FIG. 12.

A portion of polysilicon gate conductor 18 may subsequently be removed, preferably using a dry etch process, as shown in FIG. 13. In the event that a portion of silicide layer 46 remains over gate conductor 18, the etch process used must remove both silicide and polysilicon. The chosen etchant is selective to the gate conductor material so as to ensure that protective dielectrics 48 remain and that the ensuing trench is self-aligned to the sidewalls of the retained spacers. Thus, removal of a portion of gate conductor 18 forms trench 52, which is bounded by remaining portion 54 of gate conductor 18 and substantially vertical sidewalls of spacers 40. Polysilicon portion 54 may be used for a lower gate in a dual-gate structure such as a memory cell, as described further below.

Figure 14:
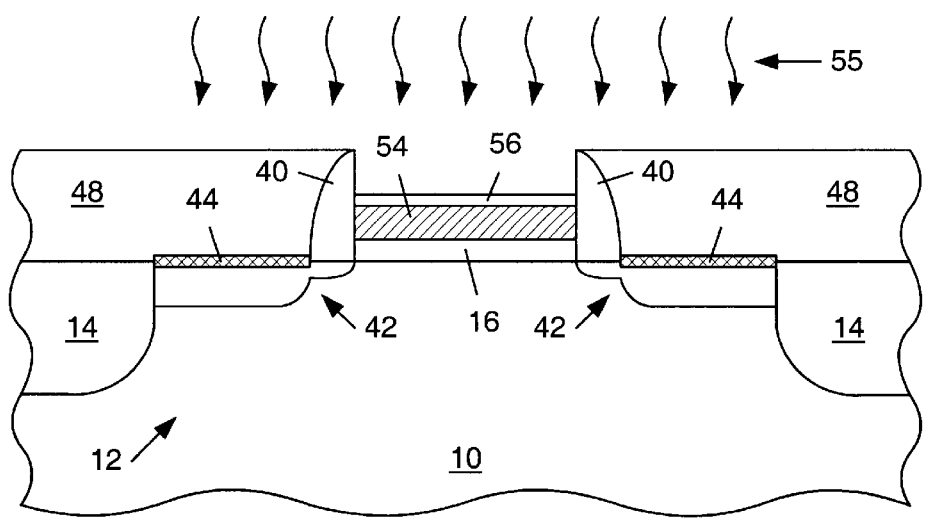
FIG. 14 is a partial cross-sectional view of the semiconductor topography wherein an oxide is formed on the remaining polysilicon gate conductor portion, subsequent to the partial gate conductor removal of FIG. 13.
Figure 15:
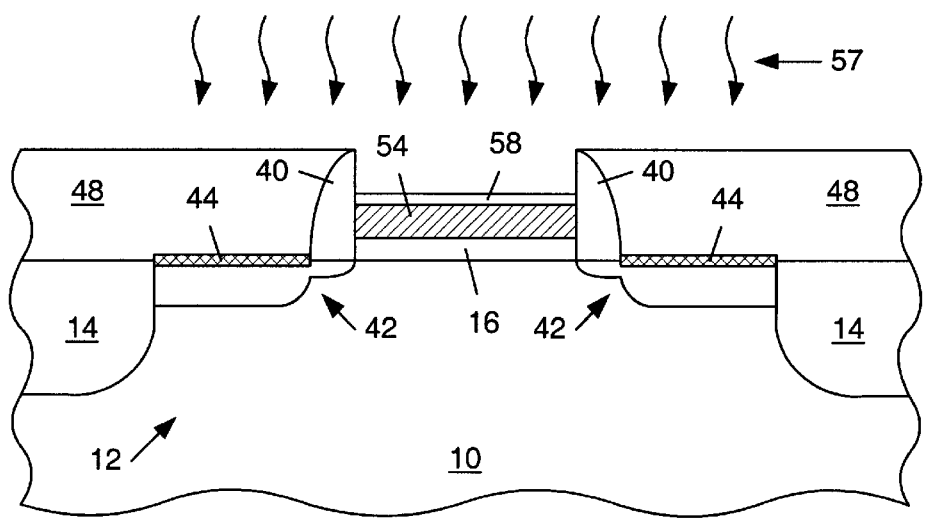
FIG. 15 is a partial cross-sectional view of the semiconductor topography wherein the oxide is heated in a nitrogen-bearing ambient, subsequent to the oxide formation of FIG. 14.

A thin dielectric 56, similar to gate dielectric 16, may be formed over polysilicon portion 54 using thermal process 55 as shown in FIG. 14. Like the process used for formation of dielectric 16, thermal process 55 preferably includes heating polysilicon portion 54 to a temperature of greater than about 700° C. in an ambient containing oxygen and/or nitrogen to grow oxide, nitride or oxynitride. A deposited dielectric may also be suitable for dielectric 56. In an embodiment for which dielectric 56 is oxide, thermal process 57 may be used to convert dielectric 56 to nitrogen-containing dielectric 58, as shown in FIG. 15. Thermal process 57 is similar to thermal process 27 discussed in the description of FIG. 5 above. In embodiments for which dielectric 56 is formed as a nitrogen-containing dielectric, thermal process 57 is believed to be unnecessary. Dielectric 58 is believed to perform the functions of providing an improved interface with polysilicon portion 54 and acting as a diffusion barrier for a subsequently-deposited overlying high-K dielectric. The thickness of dielectric 58 should be as small as is practical for performing these functions, preferably about 10 angstroms or less.

Figure 16:
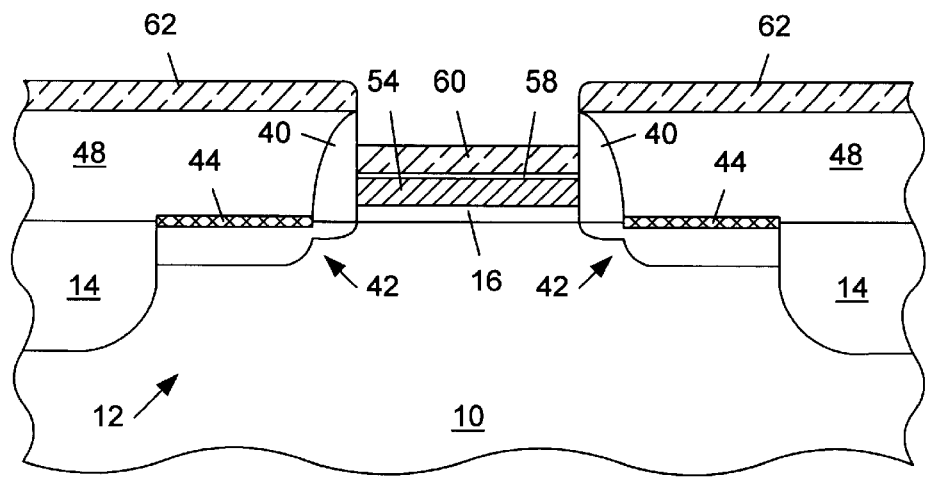
FIG. 16 is a partial cross-sectional view of the semiconductor topography wherein a high-K dielectric layer is deposited within the trench, subsequent to the heating of FIG. 15.
Figure 17:
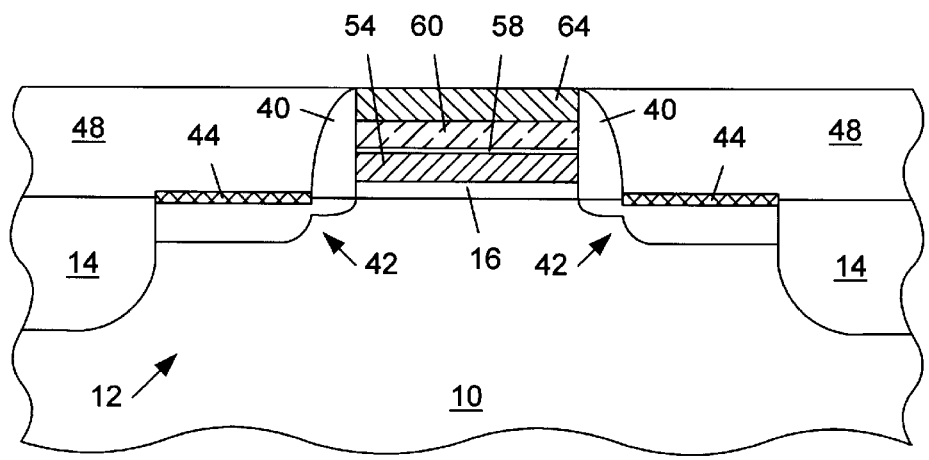
FIG. 17 is a partial cross-sectional view of the semiconductor topography wherein a conductive gate is formed within the trench above the high-K dielectric layer, subsequent to the high-K dielectric layer formation of FIG. 16.

High-K dielectric portion 60 is subsequently formed above dielectric 58, as shown in FIG. 16, while portions 62 are deposited over dielectrics 48. The possible compositions, the thickness and the deposition method for portions 60 and 62 are similar to those of high-K dielectric portions 30 and 32 shown in FIG. 6. A conformal deposition technique such as CVD may also be used for deposition of the high-K dielectric. In this case, portion 60 is U-shaped, as illustrated by the shape of portion 30 in FIG. 10, rather than uniform across the trench. Gate conductor 64 is subsequently formed within the unfilled portion of trench 52, as shown in FIG. 17. The formation of gate conductor 64 is similar to that of gate conductor 36, shown in FIGS. 7 and 8, and includes removal of portions of a deposited conductive layer external to trench 56. High-K dielectric portions 62 are preferably removed along with these external portions, but may alternatively be removed before deposition of a conductive layer to form gate conductor 64.

The dual-gate structure of FIG. 17 may be used, for example, as a memory cell in an MOS circuit, or as a test device to evaluate the particular combination of materials in the device, such as high-K dielectric 60 and gate conductor 64. If a memory cell is to be formed, subsequent lithography and deposition steps may be performed in order to make appropriate gate and bit line connections. If a test device is to be formed, dielectrics 48 are typically etched away so that rapid electrical characterization may be performed using electrical probes. Parameters which may be varied in producing a set of test devices are similar to those described in the description of FIG. 8 above. As illustrated by the above embodiments, the test structures, methods, and devices recited herein may be realized with or without sidewall spacers such as spacers 40.

It will be appreciated to those skilled in the art having the benefit of this disclosure that this invention is believed to provide a test structure for inexpensive, convenient evaluation of gate dielectrics and gate conductors in semiconductor devices, and a method for forming such a test structure. A self-aligned semiconductor device including a high-K dielectric which is not exposed to elevated processing temperatures and a method for forming such a device is also provided. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A semiconductor device, comprising:
   a pair of source/drain impurity distributions within a semiconductor substrate separated from each other by a channel;
   a first gate dielectric configured within a trench existing in lateral alignment directly above the channel, wherein the first gate dielectric has a dielectric constant greater than about 7;
   a first gate conductor configured within the trench above the gate dielectric; and
   a pair of dielectrics extending across the pair of source/drain impurity distributions and terminating to form entire sidewalls of the trench.

2. The semiconductor device as recited in claim 1, further comprising a nitrogen-containing oxide layer disposed between the channel and the first gate dielectric.

3. The semiconductor device as recited in claim 2, wherein an upper surface of the pair of dielectrics is coplanar with an upper surface of the first gate conductor.

4. The semiconductor device as recited in claim 3, wherein the pair of dielectrics includes a pair of spacers, and wherein substantially vertical sidewalls of the spacers form the sidewalls of the trench.

5. The semiconductor device as recited in claim 1, further comprising a second gate conductor configured within the trench below the first gate dielectric, and a second gate dielectric arranged below the second gate conductor.

6. The semiconductor device as recited in claim 5, further comprising a nitrogen-containing oxide layer arranged between the second gate conductor and the first gate dielectric.

7. The semiconductor device as recited in claim 1, wherein said first gate dielectric comprises a material having dielectric constant greater than 20.

8. The semiconductor device as recited in claim 1, wherein said first gate dielectric comprises tantalum oxide.

9. The semiconductor device as recited in claim 1, wherein said first gate conductor comprises a metal.

10. The semiconductor device as recited in claim 5, wherein said second gate conductor comprises polysilicon.

11. The semiconductor device as recited in claim 5, wherein said second gate dielectric comprises oxide.

12. A semiconductor test structure, comprising:
    a pair of source/drain impurity distributions within a semiconductor substrate separated from each other by a channel;
    a polysilicon gate conductor configured within a trench existing in lateral alignment directly above the channel; and
    a pair of dielectrics extending across the pair of source/drain impurity distributions and terminating to form entire sidewalls of the trench, wherein an upper surface of the pair of dielectrics is coplanar with an upper surface of the gate conductor.

13. The test structure as recited in claim 12, wherein the pair of dielectrics includes a pair of spacers, and wherein substantially vertical sidewalls of the spacers form the sidewalls of the trench.

14. The semiconductor device as recited in claim 1, wherein a thickness of the gate dielectric in a vertical direction is substantially uniform across the trench.

15. The semiconductor test structure as recited in claim 12, further comprising a gate dielectric configured within a trench existing in lateral alignment directly above the channel, wherein the gate dielectric has a dielectric constant greater than about 7.

16. The semiconductor test structure as recited in claim 12, wherein a thickness of the gate dielectric in a vertical direction is substantially uniform across the trench.

17. The semiconductor test structure as recited in claim 12, wherein the trench comprises a lowermost surface substantially commensurate with an uppermost surface of the semiconductor substrate.

18. A semiconductor device, comprising:
    a pair of junctions within a semiconductor substrate separated from each other by a channel;
    a first gate dielectric configured within a trench existing in lateral alignment directly above the channel, wherein the first gate dielectric has a dielectric constant greater than about 7;
    a first gate conductor configured within the trench above the gate dielectric; and
    a nitrogen-containing oxide layer disposed between the channel and the first gate dielectric.

19. The semiconductor device as recited in claim 18, further comprising a pair of dielectrics existing above the pair of junctions and terminating as sidewalls of the trench.

20. The semiconductor device as recited in claim 19, wherein an upper surface of the pair of dielectrics is coplanar with an upper surface of the first gate conductor.

21. The semiconductor device as recited in claim 19, wherein the pair of dielectrics includes a pair of spacers, and wherein substantially vertical sidewalls of the spacers form the sidewalls of the trench.

22. The semiconductor device as recited in claim 18, further comprising a second gate conductor configured within the trench below the first gate dielectric, and a second gate dielectric arranged below the second gate conductor.

23. The semiconductor device as recited in claim 18, further comprising a nitrogen-containing oxide layer arranged between the second gate conductor and the first gate dielectric.

24. The semiconductor device as recited in claim 18, wherein said first gate dielectric comprises a material having dielectric constant greater than 20.

25. The semiconductor device as recited in claim 18, wherein said first gate dielectric comprises tantalum oxide.

26. The semiconductor device as recited in claim 18, wherein said first gate conductor comprises a metal.

27. The semiconductor device as recited in claim 22, wherein said second gate conductor comprises polysilicon.

28. The semiconductor device as recited in claim 22, wherein said second gate dielectric comprises oxide.

* * * * *